United States Patent
Lee et al.

(10) Patent No.: US 9,780,340 B2
(45) Date of Patent: Oct. 3, 2017

(54) VERTICAL-TYPE ORGANIC LIGHT-EMITTING TRANSISTORS WITH REDUCED LEAKAGE CURRENT AND METHOD FOR FABRICATING THE SAME

(71) Applicant: SEOUL NATIONAL UNIVERSITY R&DB FOUNDATION, Seoul (KR)

(72) Inventors: Sin-Doo Lee, Seoul (KR); In-Ho Lee, Hwaseong-si (KR); Gyujeong Lee, Anyang-si (KR)

(73) Assignee: Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 15/132,481

(22) Filed: Apr. 19, 2016

(65) Prior Publication Data

US 2017/0110691 A1    Apr. 20, 2017

(30) Foreign Application Priority Data

Oct. 19, 2015 (KR) .......... 10-2015-0145581

(51) Int. Cl.
*H01L 51/52* (2006.01)
*H01L 51/56* (2006.01)

(52) U.S. Cl.
CPC .......... *H01L 51/5296* (2013.01); *H01L 51/56* (2013.01)

(58) Field of Classification Search
CPC ............... H01L 51/5012; H01L 51/504; H01L 51/5044; H01L 51/5048; H01L 51/5052; H01L 51/5056; H01L 51/506; H01L 51/5068; H01L 51/5072; H01L 51/5076; H01L 51/508; H01L 51/5084;

(Continued)

(56) References Cited

U.S. PATENT DOCUMENTS 3,493,812 A * 2/1970 Weimer .................. H01L 27/00
                                                          148/DIG. 85
6,720,572 B1 * 4/2004 Jackson ............... H01L 51/0545
                                                                 257/103

(Continued)

FOREIGN PATENT DOCUMENTS

KR    10-2008-0105027 A    12/2008
KR      10-1427776 B1       8/2014

OTHER PUBLICATIONS

Lee, G. et al., "Vertical organic light-emitting transistor showing a high current on/off ratio through dielectric encapsulation for the effective charge pathway," *Journal of Applied Physics*, 2017, pp. 024502-1 to 024502-8, vol. 121. [Online] [Retrieved Apr. 7, 2017] Retrieved from the Internet <http://dx.doi.org/10.1063/1.4974008.>.

*Primary Examiner* — Olik Chaudhuri
*Assistant Examiner* — Pauline Vu
(74) *Attorney, Agent, or Firm* — Fenwick & West LLP (57) ABSTRACT

A vertical-type organic light-emitting transistor for reducing the off-state leakage current to improve the current and on-off ratio includes a gate electrode, a lower semiconductor layer disposed on the gate electrode, a source electrode disposed on the lower semiconductor layer, and a source insulation film disposed on the source electrode and covering top and sides of the source electrode, wherein the lower semiconductor layer is configured such that an electric charge is injected into the lower semiconductor layer from the source electrode when voltage is applied to the gate electrode.

10 Claims, 7 Drawing Sheets

(58) Field of Classification Search
CPC ............. H01L 51/5088; H01L 51/5096; H01L 51/5296; H01L 51/055; H01L 51/0541; H01L 51/045; H01L 51/5203; H01L 51/102

See application file for complete search history.

(56) References Cited

U.S. PATENT DOCUMENTS

| | | |
|---|---|---|
| 8,158,970 B2 | 4/2012 | Obata et al. |
| 2009/0135105 A1* | 5/2009 | Nakamura ............. H01L 51/50 345/76 |
| 2010/0090202 A1* | 4/2010 | Obata .................. H01L 51/002 257/40 |
| 2013/0240842 A1* | 9/2013 | Rinzler ................ H01L 51/057 257/40 |
| 2014/0203249 A1 | 7/2014 | Lee et al. |

* cited by examiner

VERTICAL-TYPE ORGANIC LIGHT-EMITTING TRANSISTORS WITH REDUCED LEAKAGE CURRENT AND METHOD FOR FABRICATING THE SAME

CROSS-REFERENCE TO RELATED APPLICATION

This application claims priority to Korean Patent Application No. 10-2015-0145581, filed on Oct. 19, 2015, and all the benefits accruing therefrom under 35 U.S.C. §119, the contents of which are incorporated by reference in its entirety.

BACKGROUND

1. Field

The present disclosure relates to vertical-type organic light-emitting transistors and a method for fabricating the same, and more particularly, to technology for off-state leakage current reduction and on-off ratio improvement of vertical-type organic light-emitting transistors.

[Description about National Research and Development Support]

This study was supported by the Veteran Researcher Support Project—Leading Research Support Project of Ministry of Science, ICT and Future Planning, Republic of Korea (National Research Foundation of Korea, Project No. 2011-0028422) under the Seoul National University R&DB Foundation.

2. Description of the Related Art

Organic light-emitting transistors have a function of controlling the light emission characteristics of themselves without any additional driving device by combining organic light-emitting diodes with organic field-effect transistors. Theoretically, organic light-emitting transistors may have higher quantum efficiency and numerical aperture than organic light emitting diodes, and are thus gaining attention as a next-generation light-emitting device. Particularly, vertical-type organic light-emitting transistors have advantages in terms of a short channel length and a high current density, and a low driving voltage as well as easy device integration, as compared to general transistors.

However, vertical-type organic light-emitting transistors studied up to now have a problem: Because a source electrode blocks an electric field produced by a gate voltage, controlling electric charges injected from the top of the source electrode through the gate voltage is not easy. As a result, off-state leakage current between source-drain electrodes increases, and current and on-off ratio of a device is reduced. In this circumstance, Korean Patent No. 10-1427776 has used a method of forming a source insulation film on the top of a source electrode to prevent the injection of electric charges from the top of the source electrode in order to reduce off-state leakage current between source-drain electrodes.

However, in vertical-type transistors having a short distance between a source electrode and a drain electrode, the magnitude of an electric field between the source electrode and the drain electrode is very large, and thus, it is still not easy to control electric charges injected from the sides of the source electrode by the gate voltage. Accordingly, to apply vertical-type organic light-emitting transistors as a next-generation light-emitting device, such as, in the field of displays and lighting, first of all, an issue to be solved is to reduce off-state leakage current between source-drain electrodes to thereby improve the current and on-off ratio.

SUMMARY

According to one aspect of the present disclosure, the current and on-off ratio can be improved by reducing a leakage current of a vertical-type organic light-emitting transistor having a wide light-emitting area. This organic light-emitting transistor structure is used in combining an organic light-emitting diode with an organic field-effect transistor and can be applied to next-generation displays and photoelectric devices.

An organic light-emitting transistor according to an embodiment includes a gate electrode, a lower semiconductor layer disposed on the gate electrode, a source electrode disposed on the lower semiconductor layer, and a source insulation film disposed on the source electrode and covering top and sides of the source electrode, wherein the lower semiconductor layer is configured such that an electric charge is injected into the lower semiconductor layer from the source electrode when voltage is applied to the gate electrode.

In an embodiment, the lower semiconductor layer may have a thickness larger than 0 and smaller than or equal to 100 nm.

In an embodiment, the lower semiconductor layer may include at least one of a low molecular weight organic semiconductor material, a high molecular weight organic semiconductor material, an oxide semiconductor material, and an inorganic semiconductor material.

In an embodiment, the source insulation film may have a line width larger than 0 and smaller than or equal to 20 μm.

In an embodiment, the organic light-emitting transistor may further include an upper semiconductor layer disposed on the source insulation film, and an organic emission layer disposed on the upper semiconductor layer.

A method for fabricating an organic light-emitting transistor according to an embodiment includes forming a lower semiconductor layer on a gate electrode, forming a source electrode on the lower semiconductor layer, and forming a source insulation film on the source electrode, the source insulation film covering top and sides of the source electrode, wherein the lower semiconductor layer is configured such that an electric charge is injected into the lower semiconductor layer from the source electrode when voltage is applied to the gate electrode.

In forming the lower semiconductor layer according to an embodiment, the lower semiconductor layer may have a thickness larger than 0 and smaller than or equal to 100 nm.

In forming the lower semiconductor layer according to an embodiment, the lower semiconductor layer may include at least one of a low molecular weight organic semiconductor material, a high molecular weight organic semiconductor material, an oxide semiconductor material, and an inorganic semiconductor material.

In forming the source insulation film according to an embodiment, the source insulation film may have a line width larger than 0 and smaller than or equal to 20 μm.

In an embodiment, the method for fabricating an organic light-emitting transistor may further include forming an upper semiconductor layer on the source insulation film, and forming an organic emission layer on the upper semiconductor layer.

The organic light-emitting transistor according to one aspect of the present disclosure uses the source insulation film that fully covers the top and sides of the source electrode. As a result, the vertical organic light-emitting transistor is reduced in off-state leakage current, leading to improved current and on-off ratio.

The vertical-type organic light-emitting transistor and the method for fabricating the same according to one aspect of the present disclosure can be applied to fabrication of high performance organic light-emitting devices based on electrode and semiconductor fabrication processes easy to put it into practice, and further, can be applied to development of next-generation displays such as new photoelectric organic devices and flexible displays.

DETAILED DESCRIPTION

Hereinafter, exemplary embodiments of the present disclosure will be described in detail with reference to the accompanying drawings.

Figure 1A:
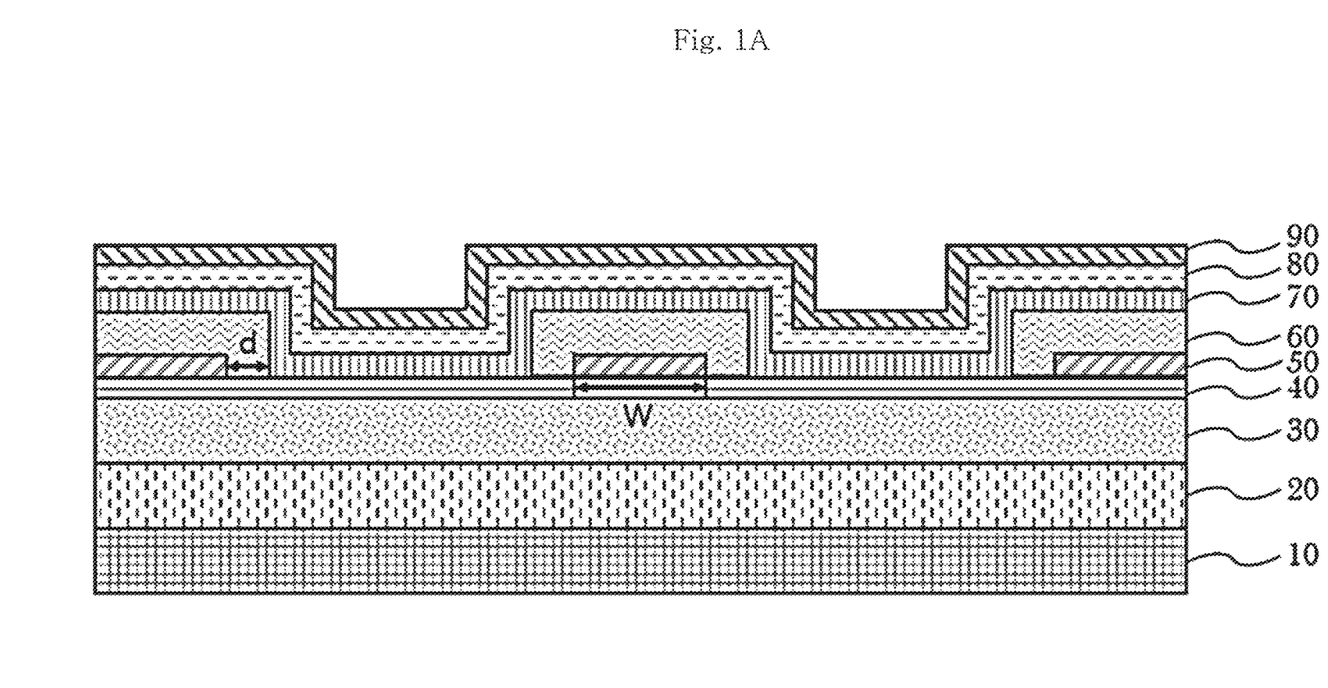
FIG. 1A is a cross-sectional view of a vertical-type organic light-emitting transistor according to an embodiment.
Figure 1B:
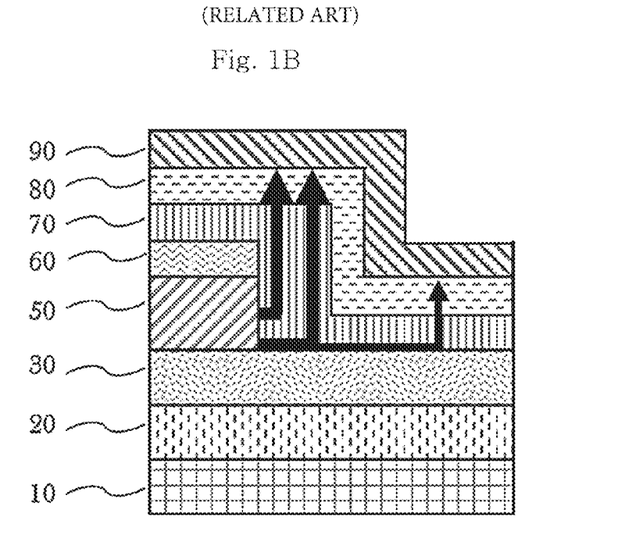
FIG. 1B is a diagram showing injection and flow of electric charges from a source electrode of a vertical-type light-emitting transistor according to a related art.
Figure 1C:
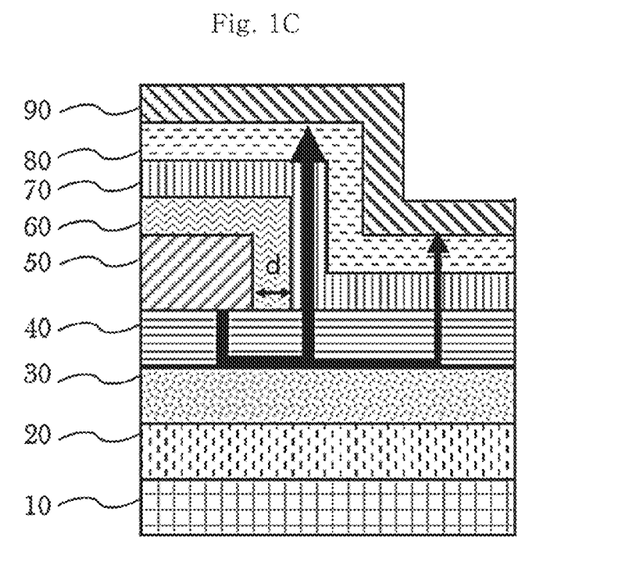
FIG. 1C is a diagram showing injection and flow of electric charges from a source electrode of a vertical-type organic light-emitting transistor according to an embodiment.

FIG. 1A is a cross-sectional view of an organic light-emitting diode according to an embodiment. FIG. 1B is a diagram showing injection and flow of electric charges in a vertical-type organic light-emitting transistor according to a related art, and FIG. 1C is a diagram showing injection and movement of electric charges in the embodiment according to FIG. 1A. In an embodiment, the organic light-emitting transistor may be a vertical-type organic light-emitting transistor having quasi-surface emission characteristics.

In an embodiment, the organic light-emitting transistor may include a comb-shaped source electrode as in FIGS. 2A and 2B described later. The comb-shaped source electrode may have a plurality of openings between each electrode, and may be provided with a source insulation film that fully covers the top and sides of the source electrode.

Also, the organic light-emitting transistor may include at least one of a substrate 10, a gate electrode 20, a gate insulation film 30 and a lower semiconductor layer 40 below a mesh-shaped source electrode 50, the source electrode 50, a source insulation film 60, an upper semiconductor layer 70, an organic emission layer 80 and a drain electrode 90. The source electrode 50 may be disposed between the gate electrode 20 and the drain electrode 90.

The substrate 10 is a part that supports the entire structure of the organic light-emitting transistor. The substrate 10 may be made of glass, quartz, high molecular weight resin (e.g., plastic), silicon, or any other suitable materials.

The gate electrode 20 may be formed on the substrate 10. The gate electrode 20 may be made of transparent electrode materials (e.g., indium-tin-oxide) capable of electrical conduction, metals such as aluminum (Al), gold (Au) and silver (Ag), non-metal materials such as conductive organic materials, conductive polymers and conductive particles, or any other suitable conducting materials. The gate electrode 20 may be formed by vacuum deposition, but is not limited thereto.

The gate insulation film 30 may be formed on the gate electrode 20. The gate insulation film 30 may be made of inorganic materials having an insulation function such as silicon oxide ($SiO_2$), organic materials such as high molecular weight insulating polymers, or any other suitable materials having properties capable of blocking the current from the gate electrode 20 and carrying the electric field by gate voltage to the lower semiconductor layer 40, but is not limited thereto.

The lower semiconductor layer 40 may be formed on the gate insulation film 30. The thickness of the lower semiconductor layer may be larger than 0 and smaller than or equal to 100 nm. In an embodiment, the thickness of the lower semiconductor layer may be 20 nm. The lower semiconductor layer 40 may be made of materials having a high electric charge mobility and available for easy electric charge injection with the source electrode 50 and the upper semiconductor layer 70 as described later, for example, low molecular weight organic semiconductor materials, high molecular weight organic semiconductor materials, oxide semiconductor materials, inorganic semiconductor materials, suitable materials capable of forming a semiconductor channel by application of voltage, or materials containing metal particles added to these materials, but is not limited thereto. Also, in an embodiment, the lower semiconductor layer may be made of pentacene having p-type semiconductor characteristics, but is not limited thereto.

The source electrode 50 may be formed on the lower semiconductor layer 40. The source electrode 50 may be made of materials having high electrical conductivity, easy to inject electric charges into the lower semiconductor layer 40 and capable of pattern formation. For example, the source electrode 50 may be made of metals such as gold (Au), non-metal materials such as conductive organic materials or conductive particles, or any other suitable conducting materials, but is not limited thereto. The source electrode 50 may be formed by depositing a conducting material in a vacuum and patterning through a photolithography method, but is not limited thereto. Also, the width W of the source electrode 50 may be larger than 0 and smaller than or equal to 100 μm. For example, the width W may be in the range of 100 nm to 5 μm. However, the width W is sufficient if it is on such a level that the source electrode is formed and has conductivity, and is not limited to a particular numerical value, and as the width W increases, an actual light-emitting area reduces, and the width W may be variously set based on the extent to which the process conditions are optimized. In an embodiment, the width W of the source electrode 50 may be 70 μm.

The source insulation film 60 may be formed on the source electrode 50 and the lower semiconductor layer 40.

The source insulation film 60 may be made of materials having good insulating properties and capable of pattern formation while not affecting the lower semiconductor layer 40. In an embodiment, the source insulation film 60 may be formed through a silicon oxide film via vacuum deposition. Alternatively, a photoresist resin material not affecting the lower semiconductor layer 40 may be left behind through photolithography such that it covers the source electrode, to allow it to act as an insulation film for the source electrode 50. Alternatively, after forming an organic insulation film using high molecular weight insulating polymers on the source electrode, a polymer insulation film having a desired pattern may be formed through an etching method using a photoresist resin material. However, an actual method for forming the source insulation film is not limited thereto. The line width d of the source insulation film may have a thickness larger than 0 and smaller than or equal to 20 μm as described later. In an embodiment, the line width d may be about 13 μm as described later.

The upper semiconductor layer 70 may be formed on the source insulation film 60 and the lower semiconductor layer 40 exposed through openings 500 of the source electrode 50. The upper semiconductor layer 70 may be made of materials capable of formation while not affecting the performance of the lower semiconductor layer 40 exposed through the openings, for example, low molecular weight organic semiconductor materials, high molecular weight organic semiconductor materials, inorganic semiconductor materials, any other suitable materials capable of forming a semiconductor channel by application of voltage, or materials containing metal particles added to the above mentioned materials, but is not limited thereto. Also, in an embodiment, the upper semiconductor layer 70 may be made of pentacene having p-type semiconductor characteristics just the same as the lower semiconductor layer 40, but is not limited thereto.

The organic emission layer 80 may be formed on the upper semiconductor layer 70. The organic emission layer 80 may be formed of a single layer using p-type semiconductor, n-type semiconductor and ambipolar semiconductor materials, or may be formed of a double layer or triple layer to control the light-emitting efficiency and color of the emitted light. In an embodiment, the organic emission layer 80 may be formed of a double layer of vacuum-deposited α-NPD(N,N'-di(1-naphthyl)-N,N'-diphenylbenzidine) and Alq3((tri-(8-hydroxyquinoline)aluminum), but is not limited thereto.

The drain electrode 90 may be formed on the organic emission layer 80. The drain electrode 90 may be made of metal or non-metal materials having high electrical conductivity and available for easy electric charge injection into the upper semiconductor layer 70 or the organic emission layer 50, similar to the source electrode 50. In an embodiment, the drain electrode 90 may be formed of a double layer of lithium fluoride (LiF) and aluminum (Al), but is not limited thereto.

Because the organic light-emitting transistor according to the embodiments described herein allows the source insulation film 60 to prevent the injection of electric charges from the top and sides of the source electrode 50, injection of electric charges is only accomplished from the bottom of the source electrode 50 into the lower semiconductor layer 40. The injected electric charges are accumulated in the lower semiconductor layer 40 by the gate voltage to form a channel, and subsequently, they spread out vertically by a drain voltage and move from the openings 500 to the drain electrode 90 through the upper semiconductor layer 70 and the organic emission layer 80. As a result, it is made easy to control the injection and movement of electric charges by the gate voltage, thereby reducing the off-state leakage current and improving the current and on-off ratio.

Specifically, electric charges move into the lower semiconductor layer 40 through the bottom of the source electrode 50, and the electric charges accumulated the lower semiconductor layer 40 by the gate voltage move to the upper semiconductor layer 70 and the organic emission layer 80 through the openings 500 of the source electrode by drain voltage, and are combined with electric charges of opposite polarity in the organic emission layer 80, leading to light emission.

FIGS. 1B and 1C are diagrams showing injection and flow of electric charges from the openings of the source electrode of the organic light-emitting transistor according to the embodiments. The arrows shown in FIGS. 1B and 1C indicate a direction in which each electric charge moves from the source electrode.

As shown in FIG. 1B, in the conventional vertical-type organic light-emitting transistor, the source insulation film 60 is disposed on top of the source electrode 50 to allow all electric charges injected from the source electrode 50 to be affected by the electric field from the gate electrode 20 to thereby control the flow of electric charges through gate voltage. However, in this case, the magnitude of the electric field between the source and drain electrodes is much larger than the magnitude of the electric field produced from the gate electrode and the electric charges injected from the sides of the source electrode are not easily controlled by gate voltage, so the off-state leakage current between source and drain increases.

In contrast, as shown in FIG. 1C, in the vertical-type organic light-emitting transistor according to the above described embodiments, because the source insulation film 60 blocks the electric charges injected from the sides of the source electrode 50, all the electric charges are injected into the lower semiconductor layer 40 and affected by the electric field from gate voltage, and the electric charges injected into the lower semiconductor layer 40 are effectively controlled through the electric field between the gate-source electrodes.

Although the organic light-emitting transistor according to the embodiments described herein is configured to have a plurality of openings formed in the source electrode, the gate electrode and/or the drain electrode of the organic light-emitting transistor may be configured to have a plurality of openings in other embodiments. For example, the gate electrode and/or the drain electrode may include a plurality of holes arranged in two dimensions or openings with a shape of a plurality of strips arranged in one dimension. By appropriately changing the electric field distribution through the mesh-shaped gate and/or drain electrode, injection and movement of electric charges from the source electrode can be achieved more effectively.

Figure 2A:
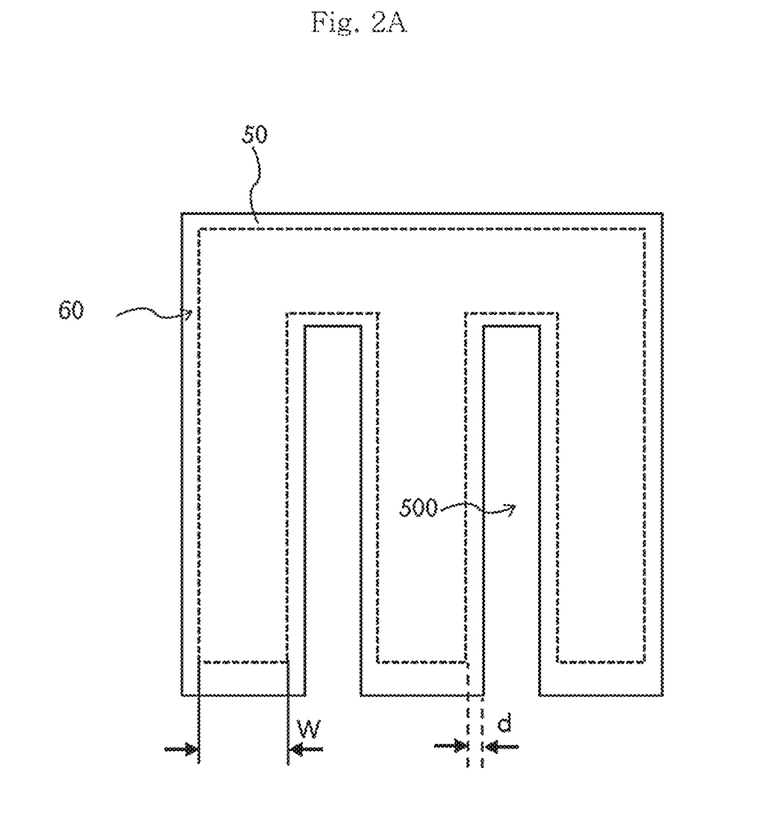
FIG. 2A is a plane view of a source electrode and a source insulation film of an organic light-emitting transistor fabricated according to an embodiment.

FIG. 2A is a plane view of the source electrode and the source insulation film of the organic light-emitting transistor according to the embodiments.

Referring to FIG. 2A, in an embodiment, the comb-shaped source electrode 50 includes the plurality of openings 500 arranged periodically, and the source electrode 50 may have an open structure in which one side is open by the openings 500. Here, the width W of the source electrode 50 may be larger than 0 and smaller than or equal to 100 μm. For example, the width W may be in the range of 100 nm to 5 μm, but a value of the width W may be variously set based on the extent to which the process conditions are optimized. In an embodiment, the width W of the source electrode 50 may be 70 μm. The source insulation film 60 fully covering the top and sides of the source electrode 50 may lie over an area expanded as much as the line width d from the boundary of the source electrode. In an embodiment, the line width d may be larger than 0 and smaller than or equal to 20 μm. In an embodiment as described later, the line width d may be 13 μm. When the source electrode 50 is viewed from top, each opening 500 may have a shape of a plurality of strips extending from the inside of the source electrode 50 and the source insulation film 60 to one side, and the plurality of strips may be arranged in one dimensional array. As a result, parts of the source electrode 50 and the source insulation film 60 except the openings 500 have a structure similar to a comb shape.

However, the shape of the source electrode 50 and the openings 500 shown in FIG. 2A is provided for illustration only, and the shape, arrangement and size of the openings formed in the electrode of the organic light-emitting transistor according to the embodiments is not limited to those shown in FIG. 2A. For example, each opening may have any circular, oval or polygonal cross sectional shape. Also, the term 'comb-shaped electrode' used herein is intended to cover the case where the openings formed in the electrode are a two dimensional closed space and the case where the openings are a one dimensional open space, and is not intended to limit to a particular location, shape and arrangement of the openings.

Further, the shape of the source electrode 50 having the openings described above is provided for illustration only, and in other embodiments, the source electrode 50 may have a shape with no separate opening.

Figure 2B:
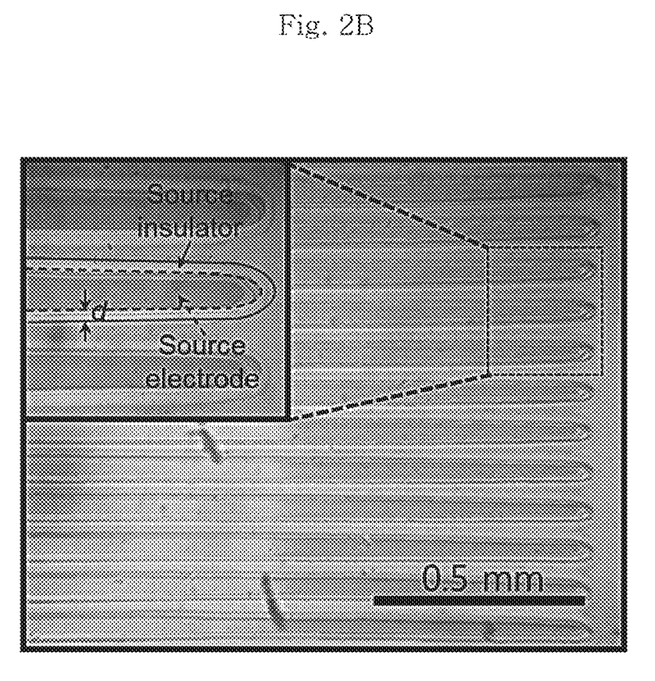
FIG. 2B is an optical microscopic image of a comb-shaped source electrode manufactured according to an embodiment.

FIG. 2B is an optical microscopic image of the source electrode and the source insulation film of the vertical-type organic light-emitting transistor of the embodiment according to FIG. 2A, showing the source insulation film formed to fully cover the top of the source electrode and the area expanded as much as the line width d from the boundary of the sides of the source electrode. As light emission is accomplished in the organic emission layer by injection and flow of electric charges from the openings into the semiconductor layer, an electrode region of the source electrode is hereinafter referred to as an electrode part, a region where the source electrode and the source insulation film overlap is referred to as an insulation part, and an opening region is referred to as a light-emitting part.

FIG. 2B shows the source electrode and the insulation film manufactured with the line width length d of the insulation part set to about 13 μm according to an embodiment. The light emission characteristics of the organic emission layer can be optimized by changing the movement and flow of electric charges into the semiconductor layer through the control of the relative size of the electrode part and the insulation part to the light-emitting part. Also, the current and on-off ratio can be optimized by controlling the off-state leakage current through the control of the length of the insulation part.

Figure 3A:
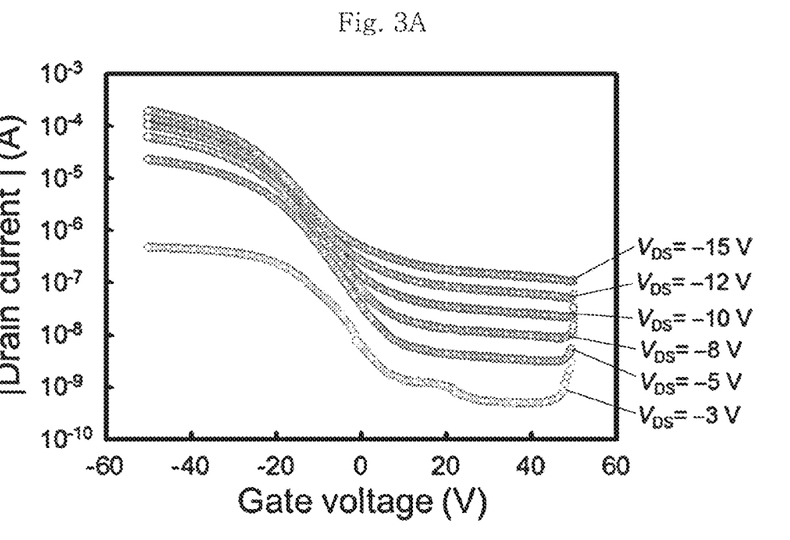
FIGS. 3A and 3B are each a transfer curve graph and an output curve graph showing electrical properties of a vertical-type organic light-emitting transistor fabricated according to an embodiment.
Figure 3B:
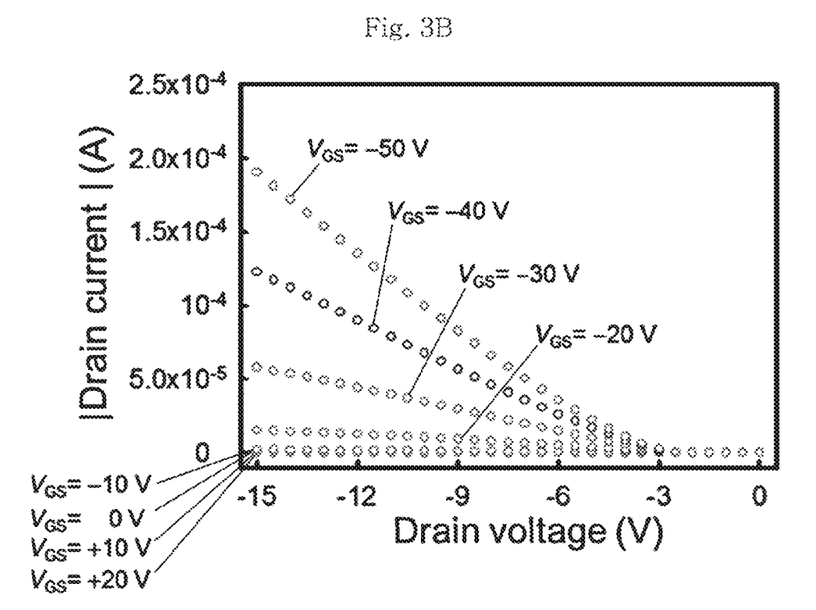

FIGS. 3A and 3B are graphs showing electrical properties as a function of gate voltage in the organic light-emitting transistor according to the embodiments.

FIG. 3A is a graph showing a transfer curve of drain current when the voltage of −10 V and 0 V is each applied to the drain electrode and the source electrode and the gate voltage is changed from 0 V to −50 V at the interval of 1 V. FIG. 3A shows the transfer characteristics in which the drain current increases with the changes in gate voltage. According to an embodiment, when the gate voltage is 0 V, namely, in the off state in which a channel is not formed in the lower semiconductor layer and only a leakage current exists, an off-state drain current value is very low. In contrast, when the gate voltage is −50 V, namely, in the on state in which as the voltage between the gate electrode and the source electrode increases in the negative direction, a channel is formed in the lower semiconductor layer and the movement of electric charges in the horizontal direction increases, and the electric charges moved in the horizontal direction move in the vertical direction by a voltage difference between the source electrode and the drain electrode, an on-state drain current value greatly increases. That is, introduction of the insulation part in which the source insulation film covers the top and sides of the source electrode to the organic light-emitting transistor reduces the leakage current, and accordingly, remarkably improves the current on-off ratio of the device.

FIG. 3B is a graph showing an output curve of drain current at different gate voltages when the voltage of −10 V and 0 V is each applied to the source electrode and the drain voltage is changed from 0 V to −15 V at the interval of 0.5 V. In this instance, according to an embodiment, the line width length (d) of the insulation part is set to about 13 μm and pentacene as a p-type organic semiconductor is used for the upper semiconductor layer and the lower semiconductor layer, but the present disclosure is not limited to this numerical value or material. Referring to FIG. 3B, in the organic light-emitting transistor according to the embodiment, the drain current changes with the change in gate voltage, and typical output characteristics of transistors can be seen in which the drain current increases as the drain voltage increases in the negative direction.

Figure 4A:
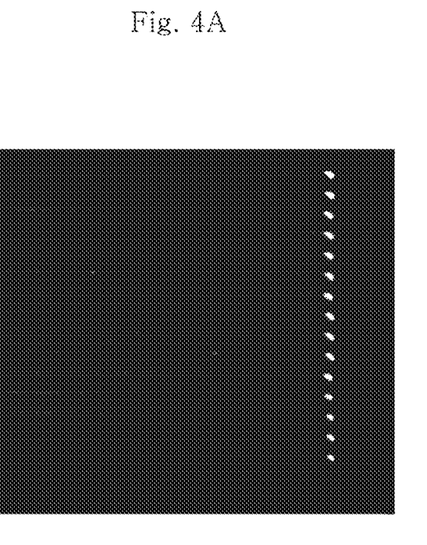
FIGS. 4A through 4C are photographic images showing light emission characteristics as a function of voltage between a source electrode and a drain electrode in an organic light-emitting transistor according to embodiments.
Figure 4B:
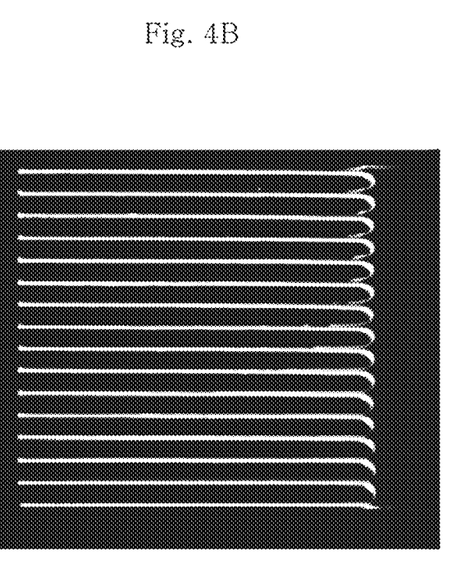
Figure 4C:
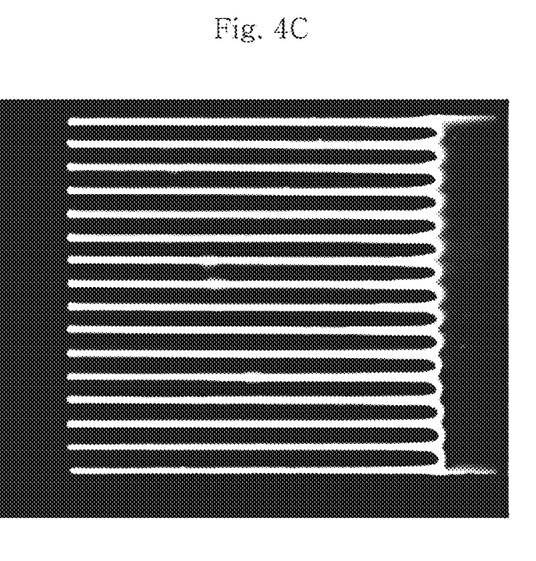

FIGS. 4A through 4C are photographic images showing changes in light-emitting area as a function of voltage between the source electrode and the gate electrode in the organic light-emitting transistor according to the embodiments. Also, FIG. 4D is a graph showing changes in luminance with the changes in voltage between the gate electrode and the source electrode in FIG. 4C.

FIGS. 4A through 4C show the light emission characteristics of the vertical-type organic light-emitting transistor according to the embodiment when the voltage of −10 V and 0 V is each applied to the drain electrode and the source electrode and the voltage of 0 V, −20 V and −50 V is each applied to the gate electrode. In this instance, according to an embodiment, a comb-shaped source electrode with an insulation part having a length d (i.e., line width) of about 13 μm is used as the source electrode. Also, pentacene as a p-type organic semiconductor is used for the semiconductor layer, but is not limited thereto.

Figure 4D:
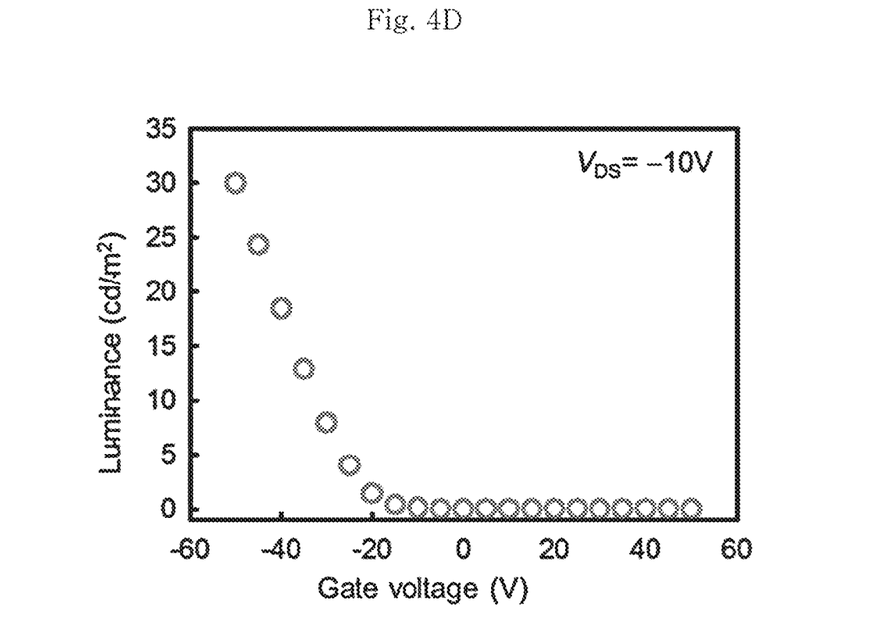
FIG. 4D is a graph showing changes in luminance as a function of voltage between a gate electrode and a source electrode in FIG. 4C.

The graph according to the embodiment of FIG. 4D is a graph showing a luminance transfer curve of the organic light-emitting transistor when the voltage −10 V and 0 V is each applied to the drain electrode and the source electrode, and the gate voltage is changed from 50 V to −50 V at the interval of 5 V. It can be seen that as the gate voltage is closer to −50 V, a luminance value increases.

The organic light-emitting transistor according to the above described embodiments introduces the organic lower semiconductor layer below the source electrode, as well as the source insulation film covering the top and sides of the source electrode to block the electric charges injected from the sides of the source electrode and allow the electric charges to be only injected into the lower organic semiconductor layer, thereby easily controlling the electric charges by the gate voltage. As a result, the vertical-type organic light-emitting transistor reduces in leakage current and achieves high current and on-off ratio.

Also, the organic light-emitting transistor and the method for fabricating the same according to the embodiments described hereinabove can be applied to fabrication of high performance organic light-emitting devices based on electrode and semiconductor fabrication processes easy to put it into practice, and further, can be applied to development of new organic photoelectronic devices and next-generation high resolution displays.

Although the present disclosure noted hereinabove has been described with reference to the embodiments shown in the accompanying drawings, this is for illustrative purposes only, and those skilled in the art will understand that various changes and modifications can be made thereto. However, it is apparent that such modifications fall within the technical scope of protection of the present disclosure. Therefore, the true technical scope of protection of the present disclosure shall be defined by the technical features of the appended claims.

What is claimed is:

1. A vertical-type organic light-emitting transistor for leakage current reduction and On-Off ratio improvement, comprising:
    a gate electrode;
    a lower semiconductor layer disposed on the gate electrode;
    a source electrode disposed on the lower semiconductor layer, the source electrode comprising a top surface, a bottom surface, and side surfaces; and
    a source insulation film disposed on the source electrode, the source insulation film covering the top surface and the side surfaces of the source electrode,
    wherein the lower semiconductor layer is configured such that electric charges are injected into the lower semiconductor layer from the bottom surface of the source electrode that is not covered by the source insulation film when a voltage is applied to the gate electrode.

2. The vertical-type organic light-emitting transistor according to claim 1, wherein the lower semiconductor layer has a thickness larger than 0 and smaller than or equal to 100 nm.

3. The vertical-type organic light-emitting transistor according to claim 1, wherein the lower semiconductor layer includes at least one of a low molecular weight organic semiconductor material, a high molecular weight organic semiconductor material, an oxide semiconductor material, and an inorganic semiconductor material.

4. The vertical-type organic light-emitting transistor according to claim 1, wherein the source insulation film has a line width larger than 0 and smaller than or equal to 20 μm.

5. The vertical-type organic light-emitting transistor according to claim 1, further comprising:
    an upper semiconductor layer disposed on the source insulation film; and
    an organic emission layer disposed on the upper semiconductor layer.

6. A method for fabricating a vertical-type organic light-emitting transistor for leakage current reduction and On-Off ratio improvement, comprising:
    forming a lower semiconductor layer on a gate electrode;
    forming a source electrode on the lower semiconductor layer, the source electrode comprising a top surface, a bottom surface, and side surfaces; and
    forming a source insulation film on the source electrode, the source insulation film covering the top surface and the side surfaces of the source electrode without covering the bottom surface of the source electrode,
    wherein the lower semiconductor layer is configured such that electric charges are injected into the lower semiconductor layer from the bottom surface of the source electrode that is not covered by the source insulation film when voltage is applied to the gate electrode.

7. The method for fabricating the vertical-type organic light-emitting transistor according to claim 6, wherein the lower semiconductor layer has a thickness larger than 0 and smaller than or equal to 100 nm.

8. The method for fabricating the vertical-type organic light-emitting transistor according to claim 6, wherein the lower semiconductor layer includes at least one of a low molecular weight organic semiconductor material, a high molecular weight organic semiconductor material, an oxide semiconductor material, and an inorganic semiconductor material.

9. The method for fabricating the vertical-type organic light-emitting transistor according to claim 6, wherein the source insulation film has a line width larger than 0 and smaller than or equal to 20 μm.

10. The method for fabricating the vertical-type organic light-emitting transistor according to claim 6, further comprising:
    forming an upper semiconductor layer on the source insulation film; and
    forming an organic emission layer on the upper semiconductor layer.

* * * * *